United States Patent [19]

Cayless

[11] Patent Number: 5,437,937
[45] Date of Patent: Aug. 1, 1995

[54] SURFACE TREATMENT OF METALS

[75] Inventor: Richard A. Cayless, 22 Wentworth Crescent, Maidenhead, Berkshire, SL6 4RW, England

[73] Assignee: Richard A. Cayless, Berkshire, England

[21] Appl. No.: 60,882

[22] Filed: May 12, 1993

Related U.S. Application Data

[63] Continuation of Ser. No. 678,341, Apr. 24, 1991, abandoned.

[30] Foreign Application Priority Data

Nov. 1, 1988 [GB] United Kingdom ............... 8825482

[51] Int. Cl.⁶ ..................... B32B 15/08; B05D 5/10
[52] U.S. Cl. ..................... 428/626; 427/207.1; 427/203; 427/409; 427/419.2; 427/419.1; 427/327; 428/632; 428/448; 428/450; 428/469
[58] Field of Search ............... 427/208.2, 207.1, 419.8, 427/405, 409, 410, 419.1, 419.2, 202, 203, 327, 632; 428/626, 623, 447, 448, 472.2, 450, 469

[56] References Cited

U.S. PATENT DOCUMENTS

| | | | |
|---|---|---|---|
| 3,592,681 | 7/1971 | Hatwell et al. | 427/319 |
| 3,715,371 | 2/1973 | Thomson | 156/326 |
| 3,860,447 | 1/1975 | Townsend | 427/372.2 |
| 3,969,152 | 7/1976 | Melotik | 148/6.15 Z |
| 4,001,870 | 1/1977 | Saiki et al. | 357/54 |
| 4,248,940 | 2/1981 | Goward et al. | 427/419.2 |
| 4,364,731 | 12/1982 | Norling et al. | 427/419.2 |
| 4,568,572 | 2/1986 | Lee et al. | 427/419.2 |
| 4,615,913 | 10/1986 | Jones et al. | 427/419.2 |
| 4,747,607 | 5/1988 | Goldie et al. | 106/14.39 |
| 4,942,083 | 7/1990 | Smith, Jr. | 427/407.1 |
| 5,013,381 | 5/1991 | Cayless et al. | 427/343 |
| 5,035,745 | 7/1991 | Lin et al. | 106/287.13 |
| 5,221,371 | 6/1993 | Miller | 148/273 |
| 5,277,936 | 1/1994 | Olson et al. | 427/405 |

FOREIGN PATENT DOCUMENTS

| | | |
|---|---|---|
| 0089810 | 9/1983 | European Pat. Off. |
| 0353957 | 7/1989 | European Pat. Off. |
| 0331284 | 9/1989 | European Pat. Off. |
| 1530257 | 7/1967 | France |
| 2183582 | 5/1972 | France |
| 2227350 | 4/1974 | France |
| 2334342 | 7/1973 | Germany |
| 59-193280 | 11/1984 | Japan |
| 61-23766 | 1/1986 | Japan |

*Primary Examiner*—Diana Dudash
*Attorney, Agent, or Firm*—Renner, Kenner, Greive, Bobak, Taylor & Weber

[57] ABSTRACT

A process for improving the ability of a metal surface to adhere comprising contacting the metal surface with an aqueous medium comprising a solution of a salt of at least one metal selected from the group consisting of yttrium and metals of the lanthanum series having atomic numbers from 57 to 71 inclusive, and subsequently contacting the metal surface with a solution of organosilane.

17 Claims, No Drawings

SURFACE TREATMENT OF METALS

This is a continuation of application Ser. No. 07/678,341 filed on Apr. 24, 1991, abandoned, which is the U.S. counterpart of International Application PCT/GB89/01277, filed Oct. 26, 1989, based upon Great Britain patent application filed on Nov. 1, 1988, all of which are claimed as priority.

This invention relates to a method of treating metal surfaces.

Organosilanes are known to be effective adhesion promoters for metal/polymer bonding. Such silanes are disclosed in "Silane Coupling Agents" by E. P. Pluddemann (Plenum Press, New York 1982).

U.S. Pat. No. 5,013,381 describes a method of treatment of a metal oxide layer, the metal oxide layer being in contact with metal in the bulk state and being formed by exposure to oxygen of the metal in the bulk state. The process is characterised in that the metal oxide layer is treated with an aqueous solution of a salt of a metal selected from a group consisting of yttrium and metals of the lanthanum series having atomic numbers from 57 to 71 inclusive for a continuous period of less than one day, the metal oxide being subsequently subjected to a drying process. The application also describes the application of an adhesive to the treated layer. However there is no suggestion that the performance of any such adhesive bond will be improved by further treatments. Our copending patent application U.S. Ser. No. 07/640,309 corresponding to published European specification EPO 353,957 describes a process for the treatment of a metal oxide layer, the metal oxide layer being in contact with a metal in the bulk state and being formed by exposure to oxygen in the bulk state. The process comprises treating the metal oxide layer with an aqueous medium containing a chromium compound and alumina in which any chromium present in solution in the aqueous medium is released from alumina particles which have been previously prepared so as to have chromate anions releasably bound to the alumina. Again there is no suggestion in this specification that the performance of adhesive bonds resulting from application of adhesive to the treated layer can be improved by a further treatment.

We have now found that improved bonding of organic materials such as adhesives to metal surfaces can be obtained by a two stage treatment.

According to the present invention there is provided a process for treating a metal surface characterised in that it comprises the steps of:
(1) contacting the metal surface with an aqueous treatment medium which is:
 a) a solution of a salt of a metal selected from the group consisting of yttrium and metals of the lanthanum series having atomic numbers from 57 to 71 inclusive, or
 b) an aqueous suspension of alumina particles to the surface of which particles chromate anions are chemically bound, and
(2) subsequently contacting the metal surface with a solution of an organosilane.

It has been found that the use of organosilanes in conjunction with certain inorganic metal surface treatments gives surprising results in adhesion promotion. The organosilane can be chosen from a wide variety of such reagents. The organosilane will preferably contain an alkoxy group preferably ethoxy or methoxy. In particular it is preferred that the organosilane is an aminosilane or an epoxy silane. The amino silane is preferably 3-(2-amino ethyl amino) propyl trimethoxy silane. The epoxy silane is preferably 2-(3-glycidyloxy) propyl trimethoxy silane.

Where the metal surface is contacted with aqueous solutions of a salt of yttrium or of a lanthanide metal, the salt is preferably a salt of yttrium, samarium or cerium. The solutions referred to can either be solutions of salts of individual metals or they can be solutions of mixed metal salts. Mixed metal salts may be derived from natural ores where the occurrence of several metals is known. The counter anion is preferably the nitrate anion because of its relatively high solubility in water. The concentration of the applied metal salt solutions can be in the range $10^{-1}$–$10^{-6}$M, preferably $10^{-2}$–$10^{-6}$M, more preferably in the range $10^{-3}$–$10^{-5}$M, for example in the range $5.0 \times 10^{-3}$–$5.0 \times 10^{-4}$M.

The aqueous suspension of alumina to the surface of which chromate anions are chemically bound is preferably an aqueous suspension such as is disclosed in our copending application (Case 6689) in which any chromium present in the aqueous medium originates from alumina particles which have been previously prepared so as to have chromate anions releasably bound to the alumina. The aqueous medium preferably contains as an active ingredient substantially only alumina particles having chromate releasably bound to alumina. The alumina having chromate anions chemically bound to its surface is referred to in the specification as "chromate alumina". "Chromate alumina" may be prepared by the method described in GB 2 071 070B. The alumina will have a chromium content (as determined by XRF) which can be in the range 0.1–6% w/w, preferably in the range 1–5% w/w, more preferably in the range 2–3% w/w. In general the alumina will preferably have a high level of surface hydroxyl groups. Examples of suitable aluminas are the commercially available activated aluminas sold under the name "Camag" and defined as having a Brockman Activity 1 for chromatography and F1 aluminas sold by the Aluminium Company of America.

Suitable particle sizes may be up to 100 micrometers diameter. The preferred particle size range is 2–10 micrometers. The chromate anion is releasably bound to the alumina. When the alumina is suspended in water, the chromate anion is released and has a finite concentration in solution.

Aqueous solutions of a salt of yttrium or of a lanthanide metal or aqueous suspensions of alumina to the surface of which chromate anions are chemically bound can be applied by any of the usual techniques used for applying reagent solutions to metal surfaces e.g. dipping, spraying, flooding etc. organic solvent, although water can be used. An example of an organic solvent is toluene. Concentration of the organosilane is preferably in the range 0.5–2% w/w.

The present invention is applicable to most metals, in particular steel, aluminium and zinc, preferably steel, more preferably cold rolled mild steel. The metal surface in the present invention may have undergone an initial cleaning step, for the purposes, for example, of removing temporary protective materials such as oil. This cleaning may be by chemical means (alkaline wash) by mechanical means (abrading) or a solvent wash may be used; such methods are well known in the art. Furthermore, the metal may be subsequently stored after treatment so that it may be used at a later date. For example, steel may be covered in a protective oil to prevent corrosion. The treatment of the present invention is storage resistant and the adhesion promotion effect is not adversely affected by such storage methods.

The treatment of metal surfaces in consecutive steps comprising treatment with an inorganic metal surface reagent followed by treatment with a solution of an organosilane is suitably used in conjunction with polymeric organic adhesives. Examples of such adhesives are epoxy resins, acrylic resins, polyurethane resins, vinyl resins, and phenolic resins, preferably epoxy resins. The organosilane can be applied prior to application of the adhesive, or alternatively it can be added to the adhesive formulation itself which can be then applied as a solution in the adhesive after the metal surface has been contacted with a) an aqueous solution of yttrium or of a lanthanide metal or b) an aqueous suspension of alumina to the surface of which chromate anions are chemically bound.

The invention may be used to increase adhesive bond strengths and to enhance the durability of adhesive bonds, particularly in aqueous environments. A typical structure using the present invention would comprise two metal objects treated according to the invention and bonded together using an adhesive. The metal objects may be different parts of the same structure. Thus the two ends of a metal sheet may be bonded together to form a tube.

The adhesion of an organic polymer surface coating to a metal surface can also be enhanced by treatment of the metal surface according to the present invention. The invention is now illustrated with reference to the following examples.

Adhesion Test Method

Mild steel test pieces (pretreated as described below) were bonded with epoxy adhesive to determine the adhesive properties of treated and untreated steel. The test pieces measured 2.54 cm by 6.35 cm and were cut from 0.75 mm steel paint test panels supplied by the Pyrene Chemical Services Ltd. This is grade CR1 cold rolled steel polished on one side only and supplied coated with a protective oil to prevent rusting. The adhesive was a simple commercially available epoxy resin; Shell Epikote 828 cured with DMP30 hardener (Anchor Chemical Company). 10 parts adhesive were mixed with one part of hardener (by weight) immediately prior to use. The steel was cleaned in an ultrasonic solvent degreasing bath (1,1,1-trichloroethylene) to remove the protective oil prior to any treatment. 2.54 cm square lap bonds were prepared by bonding the ends of the polished sides of two test pieces together with a 2.54 cm overlap. Bond line thickness was aproximately 1 mm. The adhesive was then cured at 80° C. for 1 hour.

A total of 8 such samples were prepared for each treatment. Of these, four were subjected to a durability test (400 hours immersion in distilled water at 50° C.) to determine the effect of hot wet environments on joint strength. The bond strength of the joints was determined using an Instron materials testing machine in which samples are pulled apart at constant speed and the load required to cause failure is recorded. The bonded samples are 10.16 cm long (2×6.35 cm–2.54 cm overlap), of this 1.27 cm at each end is used by the test machine grips to hold the sample. The samples were pulled apart at 0.5 mm/minute under ambient conditions. The durability (water immersion) samples were tested immediately after removal from the water.

The results of the adhesion test are recorded as average failure strengths in Table I. The percentage loss of adhesion on water immersion is also given.

Test pieces were treated according to the invention as indicated below; these pieces were then tested according to the above method. Comparative tests were carried out as described. Results are given in Table I.

Preparation of Chromate Alumina 500 liters of water are charged to a reaction vessel at ambient temperature and the agitator started. 500 Kg of $Al_2O_3$ are then added together with a sufficient amount of additional water to maintain effective agitation. The pH is monitored and $CrO_3$ added steadily such that the pH does not fall below 1. Agitation is maintained until the pH effectively stops rising. The mixture is left standing for 30 minutes. The product is then washed with deionised water to a wash water conductivity of 1,000 micro ohms per cm. The washing process involves slurrying with fresh water allowing the product to settle, decantation of the mother liquor then repeating the process. The product is finally reslurried to a solids content suitable for spray-drying. The slurry is wet ground to the desired particle size, then spray-dried. The product is micronised (finely ground) in a large ball mill to a particle size of less than 10 microns and then stored in air-tight containers.

The alumina used was Alcoa F1 (granular) supplied by Alcoa and the chromium content (% w/w) of the final dried product was 2.7% as determined by XRF.

Comparative Test A (not according to the invention)

Test pieces were tested according to the method described above, the test pieces receiving no pretreatment other than described in the method.

Comparative Test B (not according to the invention)

Steel test pieces as described above were treated by immersion in a 5% wt suspension of chromate alumina in water (100 ml per plate) for 3 minutes followed by three 1 minute washes in distilled water to remove excess material, then dried by dabbing on a tissue. Adhesive bonds were prepared and tested as described above. The results of initial strength and durability testing are given in Table I.

Comparative Test C (not according to the invention)

Test pieces were immersed in a $10^{-4}$ molar solution of yttrium nitrate in distilled water for 5 minutes, they were then rinsed twice using distilled water and dried on a tissue. The test pieces were then tested according to the method described above.

Pure compounds such as yttrium nitrate are relatively costly. Commercially available mixtures of rare earth nitrates which are much cheaper can also be used in treating test pieces (see Comparative Test D).

Comparative Test D (not according to the invention)

Treatment of test pieces was carried out according to the method described in Comparative Test C but using commercially available mixed rare earth metal nitrates. The test pieces were then tested according to the test described above.

Comparative Test E (not according to the invention)

Test pieces were immersed in a 1% w/w solution of the aminosilane $(CH_3O)_3 Si (CH_2)_3NH(CH_2)_2NH_2$ then washed 3 times for 1 minute in toluene. The plates were allowed to dry, excess toluene being removed with a tissue, bonded and tested as described above.

Example 1 (according to the invention)

Test pieces were treated as described in Comparative Test B, then treated with aminosilane as described in Comparative Test E. The test pieces were bonded and tested as described above.

Example 2 (according to the invention)

Test pieces were treated as described in Comparative Test C, then treated with aminosilane as described in Comparative Test E. The test pieces were bonded and tested as described above.

Example 3 (according to the invention)

Test pieces were treated as described in Comparative Test D, then treated with aminosilane as described in comparative Test E. The test pieces were bonded and tested as described above.

Example 4 (according to the invention)

Test pieces were treated as described in Comparative Test B. The test pieces were bonded and tested as described above except that 1% by weight of the aminosilane $(CH_3O)_3 Si (CH_2)_3NH(CH_2)_2NH_2$ was added to the epoxy adhesive prior to bonding.

Comparative Test F (not according to the invention)

Test pieces were treated as described in Comparative Test A. The test pieces were bonded and tested as discussed above except that 1% by weight of the aminosilane $(CH_3O)Si(CH_2)_3NH(CH_2)_2NH_2$ was added to the epoxy adhesive prior to bonding.

Results of all the testing according to the method described above for Comparative Tests A–F and Examples 1–5 are given in Table I.

The yttrium nitrate was supplied by BDH. The rare earth metal nitrate was supplied by Rare Earth Products (Widnes, Cheshire) as a solution of the metal oxides neutralised with nitric acid and subsequently diluted as needed.

The aminosilane was supplied by Fluka.

Alcoa, Epikote and Instron are all Trade Marks.

TABLE I

| TEST EXAMPLE | TREATMENT | INITIAL STRENGTH | 400 HR STRENGTH | % LOSS |
|---|---|---|---|---|
| A | Untreated | 3.33 | 2.45 | 26 |
| B | Chromate Alumina No aminosilane | 3.67 | 3.20 | 13 |
| C | $Y(NO_3)_3$ No aminosilane | 3.39 | 2.86 | 16 |
| D | Mixed rare earth metal nitrates. No aminosilane | 3.53 | 3.04 | 14 |
| E | Aminosilane | 4.01 | 3.01 | 25 |
| 1 | Chromate Alumina/ aminosilane | 4.01 | 3.71 | 7.5 |
| 2 | $Y(NO_3)_3$/aminosilane | 4.33 | 3.78 | 12.7 |
| 3 | Mixed rare earths/ aminosilane | 4.42 | 4.05 | 8.4 |
| 4 | Chromate alumina/ aminosilane in adhesive | 3.87 | 3.82 | 1.5 |
| F | Aminosilane in adhesive | 3.79 | 3.01 | 21 |

I claim:

1. A process for improving the adhesion properties of a metal surface selected from the group consisting of steel and zinc, comprising:
   cleaning the metal surface followed sequentially by
   (1) contacting the metal surface with an aqueous medium comprising a solution of a salt of at least one metal selected from the group consisting of yttrium and metals of the lanthanum series having atomic numbers from 57 to 71 inclusive, and
   (2) subsequently contacting the metal surface with a solution of organosilano.

2. A process for improving the adhesion properties of a metal surface comprising:
   (1) contacting the metal surface with an aqueous metal salt solution wherein the metal of the salt is selected from the group consisting of at least one of yttrium and metals of the lanthanum series having atomic numbers from 57 to 71 inclusive,
   (2) subsequently contacting the metal surface with a solution of organosilane, and
   (3) applying an organic polymer adhesive coating subsequently to or simultaneously with the step of contacting the metal surface with said solution of the organosilane.

3. A process according to claim 2 wherein the aqueous metal salt solution comprises a solution of a salt of at least one metal selected from the group consisting of yttrium, samarium or cerium.

4. A process according to claim 2 wherein said salt is a nitrate salt.

5. A process according to claim 2 wherein said salt has a concentration in the range of $10^{-1}$–$10^{-6}$M.

6. A process according to claim 2 wherein the organosilane contains an alkoxy group.

7. A process according to claim 6 wherein the alkoxy group is ethoxy or methoxy.

8. A process according to claim 2 wherein the organosilane is an aminosilane or an epoxy silane.

9. A process for improving the adhesion properties of a metal surface comprising:
   (1) contacting the metal surface with an aqueous treatment medium which is an aqueous suspension of alumina particles to the surface of which particles chromate anions are chemically bound, and
   (2) subsequently contacting the metal surface with a solution of organosilane.

10. A process according to claim 9 wherein the metal is treated with an aqueous suspension of alumina with a chromium content in the range 0.1 to 6% weight.

11. A process according to claim 10 wherein the chromium content is the range 1-5% weight.

12. A process according to claim 11 wherein the chromium content is in the range 2-3% weight.

13. A process according to claim 9 wherein the alumina particles have a diameter up to 100 micrometers.

14. A process according to claim 13 wherein the alumina particles have a diameter in the range 2-10 micrometers.

15. A process according to claim 9 further comprising applying a layer of an organic polymer surface adhesive coating subsequently to or simultaneously with the step of contacting the metal surface with said solution of the organosilane.

16. A structure comprising two metal objects having treated surfaces which have
   (1) been treated by being contacted with an aqueous treatment medium which is:
       a) a solution of a salt of a metal selected from the group consisting of yttrium and metals of the lanthanum series having atomic numbers from 57 to 71 inclusive, or
       b) an aqueous suspension of alumina particles to the surface of which particles chromate anions are chemically bound, and
   (2) subsequently been contacted with a solution of an organo silane, and
   (3) bonded together by a layer of a polymeric organic adhesive.

17. A process for treating a mild steel comprising:
   (1) contacting the steel surface with an aqueous metal salt solution wherein metal is selected from the group consisting of at least one of yttrium and metals of the lanthanum series having atomic numbers from 57 to 71 inclusive, and
   (2) subsequently contacting the steel surface with a solution of organosilane.

* * * * *